United States Patent [19]

Hirano

[11] Patent Number: 5,633,479
[45] Date of Patent: May 27, 1997

[54] MULTILAYER WIRING STRUCTURE FOR ATTAINING HIGH-SPEED SIGNAL PROPAGATION

[75] Inventor: Naohiko Hirano, Kawasaki, Japan

[73] Assignee: Kabushiki Kaisha Toshiba, Kawasaki, Japan

[21] Appl. No.: 506,518

[22] Filed: Jul. 25, 1995

[30] Foreign Application Priority Data

Jul. 26, 1994 [JP] Japan ..................... 6-174236

[51] Int. Cl.⁶ ..................... H05K 1/02
[52] U.S. Cl. ............ 174/255; 333/243; 333/246; 333/161; 174/262; 361/805; 361/794
[58] Field of Search ............ 361/805, 792, 361/793, 794, 795; 174/255, 262; 439/47, 74; 333/243, 1, 161, 246

[56] References Cited

U.S. PATENT DOCUMENTS

3,876,822  4/1975  Davy et al. .................. 174/68.5
4,054,939  10/1977  Ammon .................. 361/414
5,136,123  8/1992  Kobayashi et al. .................. 174/258

*Primary Examiner*—Laura Thomas
*Attorney, Agent, or Firm*—Finnegan, Henderson, Farabow, Garrett & Dunner, L.L.P.

[57] ABSTRACT

Signal wiring layers are formed between a power supply layer and a ground layer, which have conductor patterns each constituted by a plurality of parallel strip-shaped conductors. The above layers are isolated from each other by insulating layers. The signal wiring layer has wires which are arranged in parallel with the parallel strip-shaped conductors of the conductor pattern of the power supply layer, and the signal wiring layer has wires which are arranged in parallel with the parallel strip-shaped conductors of the conductor pattern of the ground layer.

15 Claims, 7 Drawing Sheets

MULTILAYER WIRING STRUCTURE FOR ATTAINING HIGH-SPEED SIGNAL PROPAGATION

BACKGROUND OF THE INVENTION

1. Field of the Invention

The present invention relates to a multilayer wiring structure of a multilayer wiring board (a multilayer circuit board for a multi-chip module) on which a plurality of semiconductor elements are to be mounted.

2. Description of the Related Art

Figure 1:
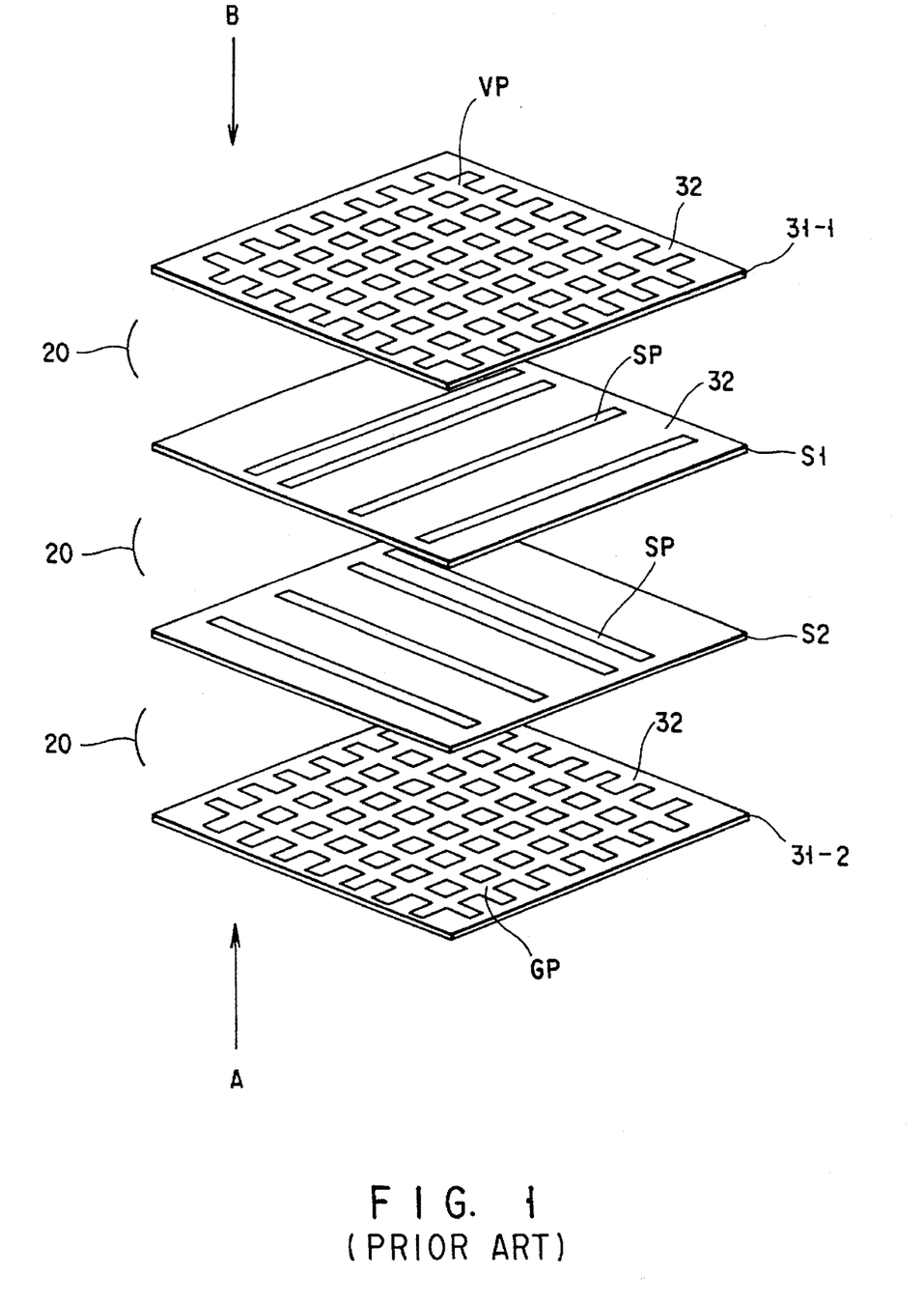
FIG. 1 is an exploded perspective view showing power supply/ground layers and signal wiring layers of a multilayer wiring board for use in a conventional semiconductor device having a multilayer structure.

FIG. 1 is an exploded perspective view of a multilayer wiring board for use in a conventional semiconductor device having a multilayer wiring structure. As shown in FIG. 1, the board comprises signal wiring layers S1 and S2, a power supply layer 31-1, and a ground layer 31-2. The signal wiring layers S1 and S2 are provided between the power supply layer 31-1 and the ground layer 31-2. The layers S1, S2, 31-1 and 31-2 are isolated from each other by insulating layers 20 (not shown). Each signal wiring layer comprises an insulator 32 and signal wires SP provided on the insulator 32. The power supply layer 31-1 comprises an insulator 32 and a mesh power-supply conductor pattern VP provided on the insulator 32. The ground layer 31-2 comprises an insulator 32 and a mesh ground conductor pattern GP.

Figure 2:
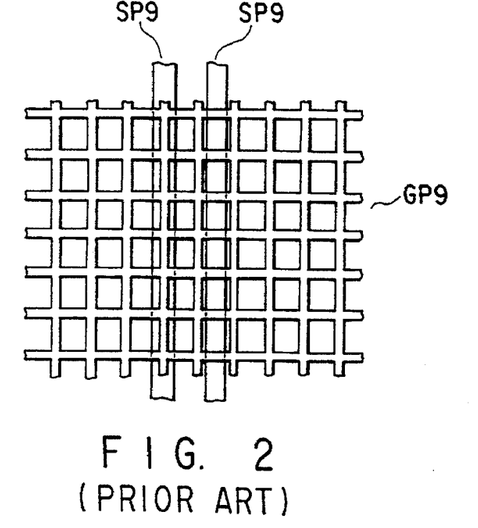
FIG. 2 is a plan view showing portions of the structure shown in FIG. 1 as viewed in a given direction.

FIG. 2 is a plan view showing the mesh ground conductor pattern GP9 and the signal wires SP9 of the signal wiring layer S2 as viewed in a direction A shown in FIG. 1. The signal wires SP9 are arranged in parallel with each other and extend parallel to the column lines of the ground conductor pattern GP9 and perpendicular to the row lines thereof. The signal wires SP9 of the power supply layer 31-1 have the same positional relationship with the conductor pattern VP of the signal wiring layer S1, when viewed in a direction B shown in FIG. 1.

Figure 3:
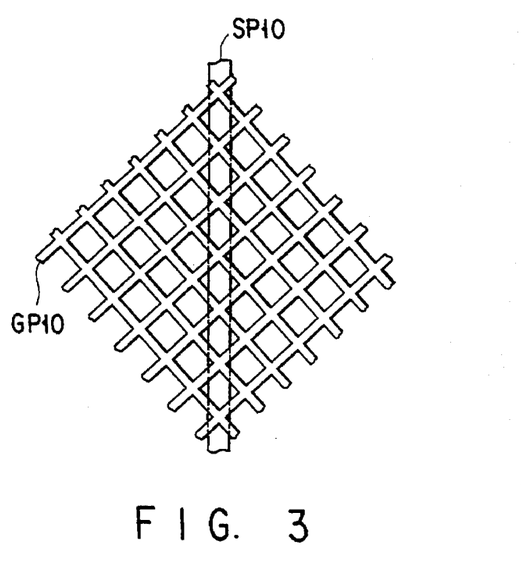
FIGS. 3 to 5 are plan views each of which shows portions of another structure as viewed in the same direction as in FIG. 2.
Figure 4:
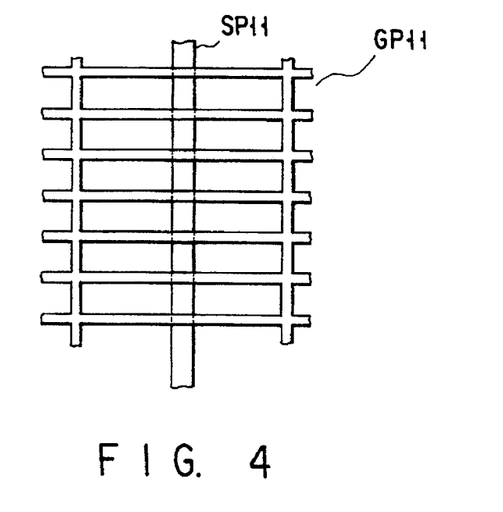
Figure 5:
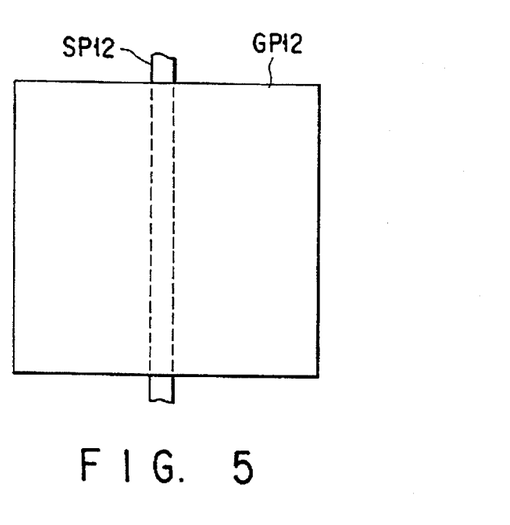

FIGS. 3 to 5 are plan views showing other pattern structures. The pattern structure shown in FIG. 3 has signal wires SP10 (only one shown) which extend at 45° to the column and row lines of the ground pattern GP10. The pattern structure shown in FIG. 4 has a ground conductor pattern GP11 having far less column lines than row lines, and wires SP11 (only one shown) extend parallel to the column lines of the pattern GP11. The pattern structure shown in FIG. 5 has a plane ground conductor pattern GP12, and wires SP12 (only one shown) extend parallel to one side of the conductor GP12.

Both line capacitance and line inductance are important design items of a signal wiring structure suitable for high-speed signal propagation. This is because a signal-propagation delay constant Tpd is given as:

$$Tpd = \sqrt{(L \cdot C)} \qquad (1)$$

where L is line inductance per unit length and C is line capacitance per unit length.

The greater the line capacitance C, the greater the overlapping area of the conductor and the wire, if the insulating layers provided between the conductor patterns and the wiring patterns have the same thickness, and are made of the same material. Of the structures shown in FIGS. 2 to 5, the structure shown in FIG. 5 has the largest capacitance C, the structure shown in FIG. 4 the smallest capacitance C, and each of the structures 2 and 3 has intermediate capacitance C.

The line inductance L can be expressed as:

$$L = Ls + Lg - 2M = Ls + Lg - 2k\sqrt{(Ls \cdot Lg)} \qquad (2)$$

(k=coupling coefficient)
where is Ls is self-inductance of the signal wire SP, Lg is self-inductance of the conductor pattern GP of the ground layer, and M is mutual inductance of the signal wire SP and the conductor pattern GP.

Figure 6:
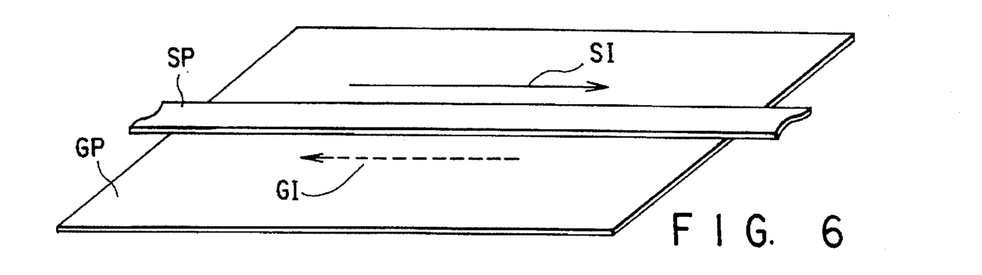
FIG. 6 is a perspective view for explaining line inductance.

As shown in FIG. 6, when a signal current SI flows in the signal wire SP, a current GI (a return current) flows in the conductor pattern GP in the opposite direction. The current GI increases the mutual inductance of the signal wire SP and the ground pattern GP. As a result, the line inductance increases. Therefore, the mutual inductance increases to a maximum, if the conductor completely overlaps with the wire in parallel therewith. If the conductor extends perpendicular to the wire, the mutual inductance decreases to almost nil.

In the multilayer wiring structure, the mutual inductance is an important factor reducing the line inductance. For example, of the structures of FIGS. 2 to 5, the structure of FIG. 5 has the largest mutual inductance M, the structure of FIG. 4 the smallest inductance M, and each of the structures of FIGS. 2 and 3 intermediate inductance M. Thus, the line inductance L of the structure of FIG. 4 is the largest, that of the structure of FIG. 5 the smallest, and that of each of the structures of FIGS. 2 and 3 intermediate.

As may be understood from the above, in the parameter design of the wiring structure, the line inductance L, as well as the line capacitance C, is important in the above equation (1).

In the structures of FIGS. 2 to 4, the line capacitance decreases, but the line inductance considerably increases, since it is not decreased by the mutual inductance. This is because a power supply/ground current hardly flow in the direction opposite to the signal current. Thus, the structures of FIGS. 2 to 4 increase the line inductance, and also the signal propagation delay time as the equation (1) indicates. Obviously, those structures are not suitable for high-speed signal propagation. In other words, a structure needs to reduce the line inductance if used to achieve high-speed signal propagation. It is preferable that the power supply/ground layer have a plane conductor like the conductor pattern of the power supply/ground layer of FIG. 5.

However, with the multilayer wiring structure, it is necessary to discharge gas or moisture from the insulating layer to the outside during formation of the insulating layer, if the insulating layer is formed of resin material such as polyimide. To discharge the gas or moisture easily, the power supply/ground layer needs to have a mesh conductor pattern. Such a power supply/ground layer, as explained above, is inferior to the power supply/ground layer having a plane conductor pattern in terms of the electrical characteristic. For example, in the power supply/ground layer having the mesh conductor pattern, the propagation delay time increases or a signal wave is distorted.

Very few analyses have been made of the electrical characteristics of the mesh patterns. To design the mesh conductor pattern, a TEM wave approximation method is generally used, for determining the line capacitance of the signal wire and the power supply/ground layer. In other words, the TEM wave approximation method does not involve the line inductance. However, to design a signal wiring layer suitable for high-speed signal propagation, the line inductance, as well as the line capacitance, must be considered, as is clear from the above explanation and the above equation (1).

Thus, in the mesh conductor pattern formed according to the TEM wave approximation method, the line inductance may increase. Therefore, in designation of the conductor pattern, it should be noted that a conductor pattern for optimizing the line capacitance is not necessarily the same as a conductor pattern for optimizing the line inductance.

SUMMARY OF THE INVENTION

The present invention has been developed in consideration of the above circumstances. In other words, the object of the present invention is to provide a multilayer wiring structure which is optimum for high-speed signal propagation, and which also establishes an optimum geometrical positional relationship between signal wires and power supply/ground conductors.

The object of the present invention is achieved by a structure characterized by comprising:

- a potential supply layer including a plurality of parallel strip-shaped conductors each of which has a predetermined potential; and
- a signal wiring layer which includes a signal wires arranged in parallel with the conductors of the potential supply layer, and which is provided on the potential supply layer, with an insulating layer interposed between the potential supply layer and the signal wiring layer.

In a multi-chip module or the like which is required to propagate a signal at a higher speed, the function of a wiring board is swayed by how deterioration of the electrical characteristic of the multi-chip module or the like is restricted. Therefore, in the present invention, the potential supply layer, as mentioned above, includes the parallel strip-shaped conductors arranged in parallel with the signal wires situated just below or just above the potential supply layer. By virtue of this feature, the structure of the present invention propagates a signal at a higher speed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

In high-speed signal propagation, it is necessary to propagate a TEM wave, and thus provide two conductor propagation paths, which are used in e.g. a coaxial cable. In the case where the two conductor propagation paths are applied to a two-dimensional structure similar to that of a wiring board, it is preferable that the conductor propagation paths include signal wires and power supply/ground layers, and each of the power supply/ground layers have a plane conductor pattern. However, in fact, such a conductor pattern cannot be provided on the power supply/ground layer in view of manufacturing processes of the wiring board.

Figure 7:
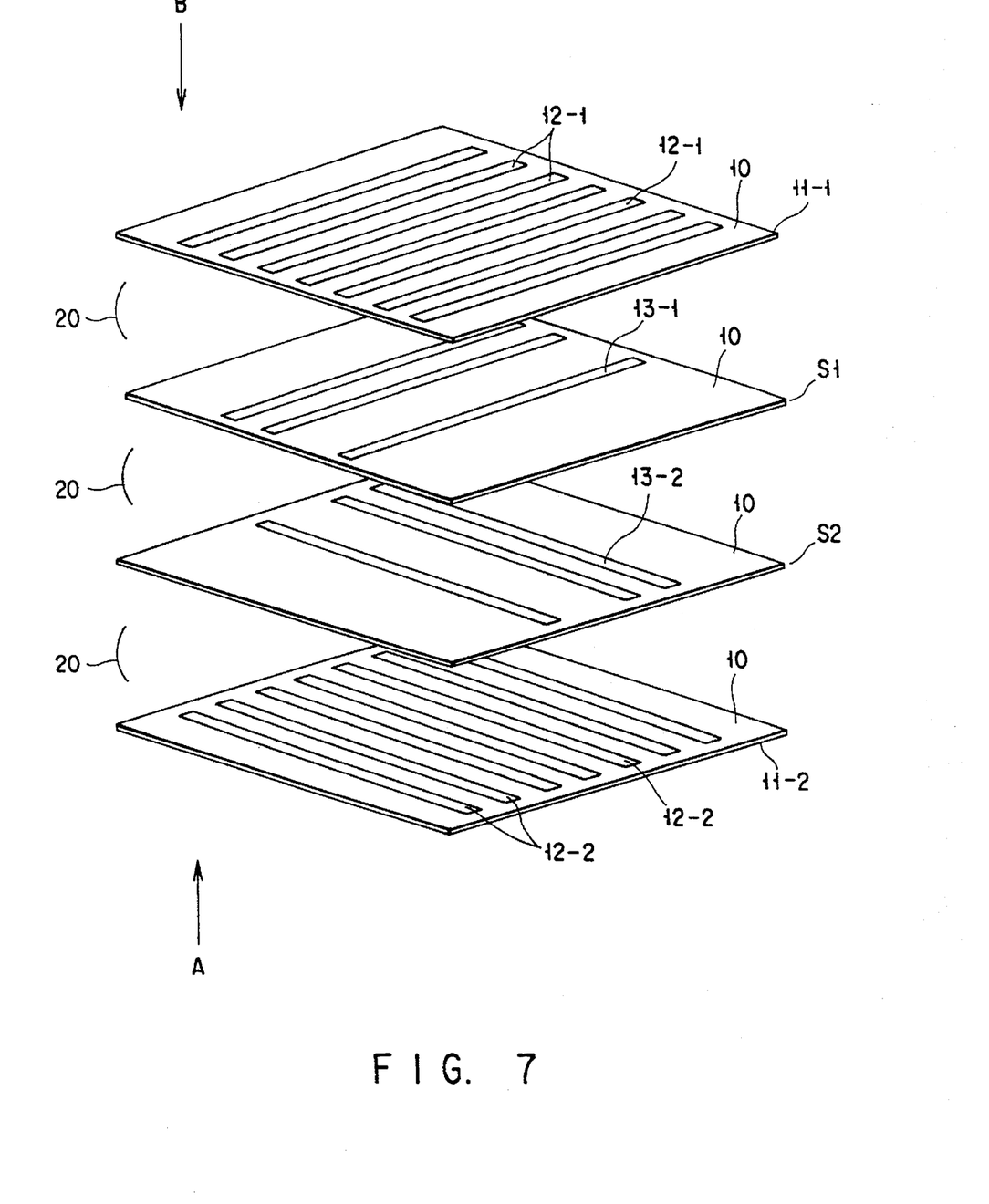
FIG. 7 is an exploded perspective view showing power supply/ground layers and signal wiring layers of a multilayer wiring board for use in a semiconductor device having a multilayer wiring structure according to the first embodiment of the present invention.

The present invention is intended to provide a multilayer structure which is optimized with respect to the electrical characteristic. The multilayer structure has been obtained on the basis of an analysis of a geometrical positional relationship between the conductor pattern and signal wires, and will be explained as follows:

FIG. 7 is an exploded perspective view showing a multilayer wiring board for use in a semiconductor device having a multilayer wiring structure according to the first embodiment of the present invention. As shown in FIG. 7, the board comprises signal wiring layers S1 and S2, a power supply layer 11-1, and a ground layer 11-2. The signal wiring layers S1 and S2 are provided between the power supply layer 11-1 and the ground layer 11-2. The layers S1, S2, 11-1 and 11-2 are isolated from each other by insulating layers 20 (not shown). The signal wiring layer S1 comprises an insulator 10 and signal wires 13-1 provided thereon, and the signal wiring layer S2 comprises an insulator 10 and signal wires 13-2 provided thereon. The power supply layer 11-1 comprises an insulator 10 and a power supply conductor pattern constituted by parallel strip-shaped conductors 12-1. The ground layer 11-2 comprises an insulator 10 and a ground conductor pattern constituted by parallel strip-shaped conductors 12-2.

Specifically, the signal wires 13-1 of the signal wiring layer S1 are arranged in parallel with the conductors 12-1 of the power supply conductor pattern, and the signal wires 13-2 of the signal wiring layer S2 are arranged in parallel with the conductors 12-2 of the ground pattern. In other words, it is important that the conductors 12-1 of the power supply conductor pattern and the conductors 12-2 of the ground pattern are arranged parallel to the signal wires 13-1 and the signal wires 13-2, respectively. By virtue of the above feature, a return current flows smoothly in each of the power supply/ground layers in the direction opposite to the flowing direction of a signal current. As a result, line inductance is reduced by mutual inductance of the signal wire layers and the power supply/ground layers.

The line inductance and line capacitance are optimized, when the conductor pattern of the power supply/ground layer has a geometrical positional relationship with the signal wires as explained below with reference to FIG. 8.

Figure 8:
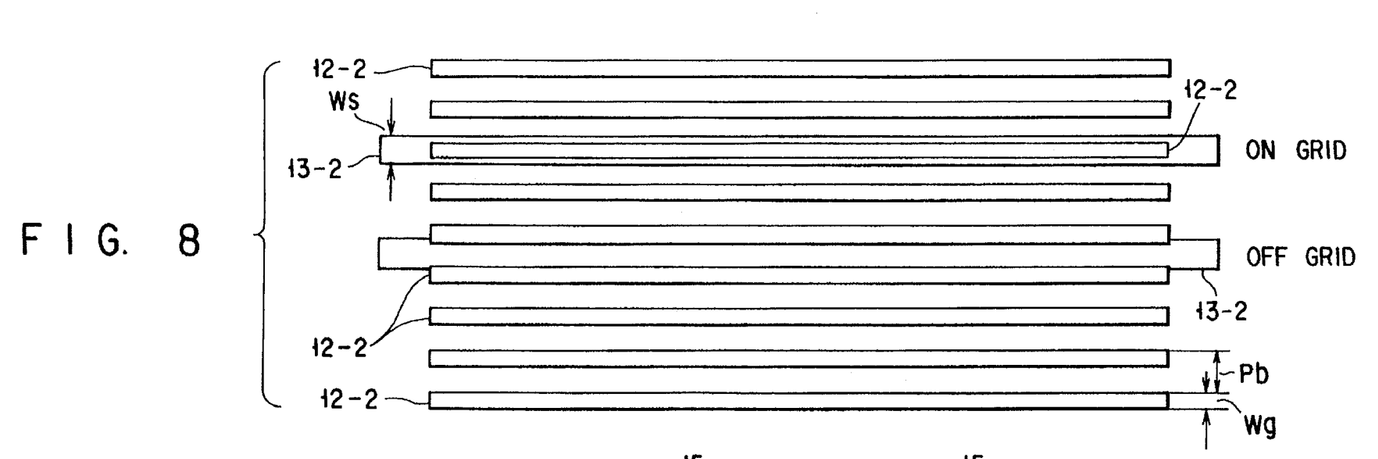
FIG. 8 is a plan view showing portions of the structure shown in FIG. 7.

FIG. 8 is a plan view showing the conductors 12-2 of the ground conductor pattern of the ground layer 11-2 and the signal wires 13-2 of the signal wiring layer S2 as viewed in a direction A shown in FIG. 7. The signal wires 13-2 of the signal wiring layer S2 extend parallel to the conductors 12-2 of the ground conductor pattern.

In the present application, in the case where the signal wires and the conductors of the power supply/ground layer are viewed in the direction A or B shown in FIG. 7, "ON GRID" refers to a positional relationship wherein the signal wire is situated opposite to the conductor, and "OFF GRID" refers to a positional relationship wherein the signal wire is situated between the conductors, as in FIG. 8.

It is preferable that the positional relationship between the signal wire 13-2 and the conductor 12-2 of the ground layer should be either "ON GRID" or "OFF GRID".

The positional relationship between the conductor pattern of the ground layer 11-2 and the wires 13-2 of the signal wiring layer S2 is the same as that positional relationship between the conductor pattern of the power supply layer 11-1 and the wires 13-1 of the signal wiring layer S1 which is established as viewed in the direction B shown in FIG. 7.

In FIG. 8 and formulas (3) set out below, the width of each of the conductors 12-2 of the ground layer 11-2 is denoted by Wg, the pitch (hereinafter referred to as "pattern pitch") at which the conductors are arranged is denoted by Pb, and the width of each of the signal wires 13-2 is denoted by Ws. When the geometrical relationship between the conductor of the ground layer and the signal wire satisfies the following formulas:

$$Wg \leq 2.0\ Ws,\ Pb \leq 3.0\ Ws \qquad (3)$$

the signal-propagation delay constant Tpd of the case where the signal wire 13-2 is in ON GRID relative to the conductor is substantially equal to that of the case where the signal wire 13-2 is in OFF GRID relative to the conductor. In other words, if the width of the conductor 12-2 is less than twice the width of the signal wire 13-2, and the pattern pitch is less than three times the width of the signal wire 13-2, optimum conductor and wiring (wires) patterns are provided, which decrease signal propagation delay time to a minimum and do not much distort a signal wave.

Therefore, the wiring pattern has an electrical characteristic to attain high-speed signal propagation, and easily decreases the line inductance. Thus, the structure shown in FIG. 7 has a similar electrical characteristic to that of the structure shown in FIG. 5.

Figure 9:
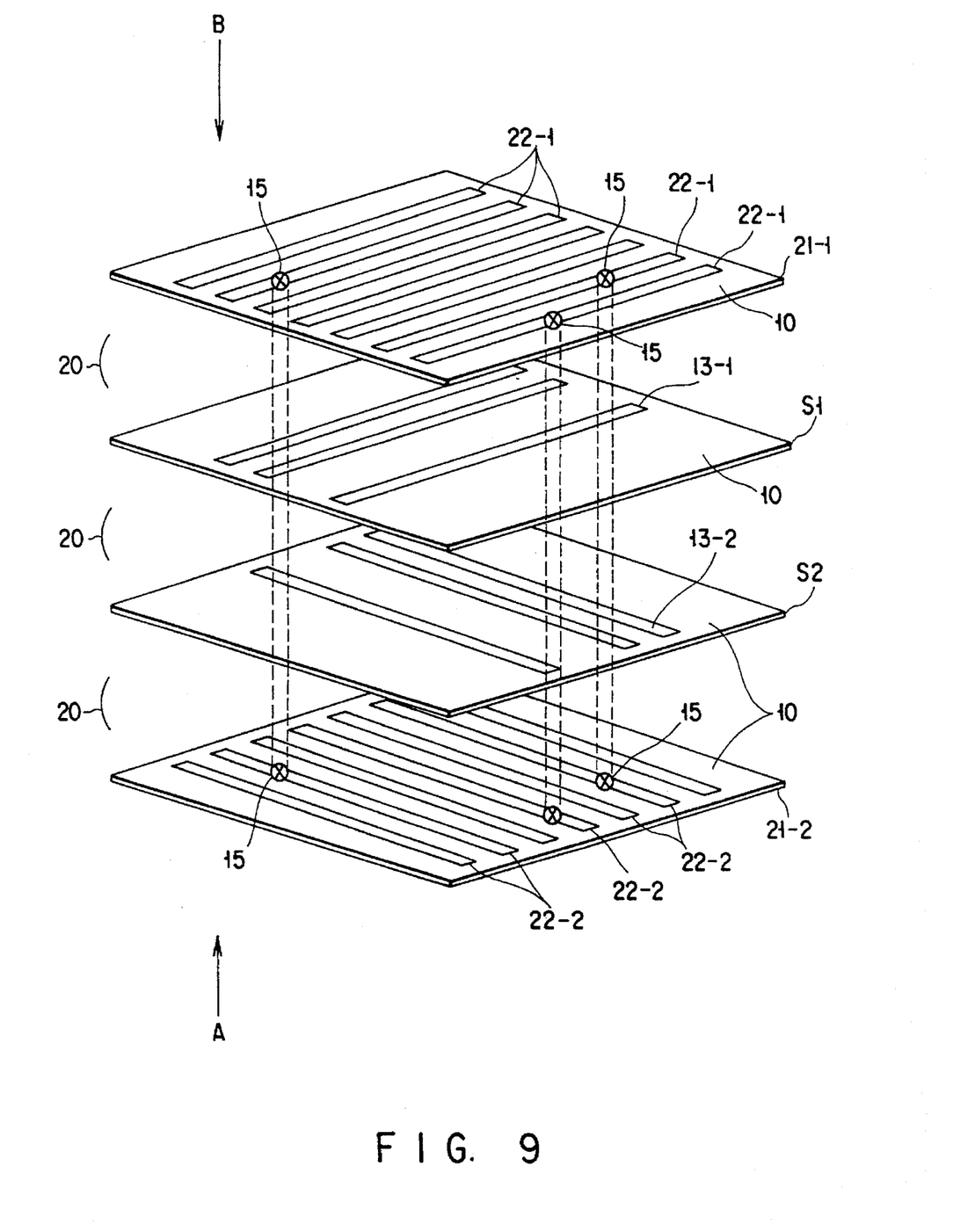
FIG. 9 is an exploded perspective view showing power supply/ground layers and signal wiring layers of a multilayer wiring board for use in a semiconductor device having a multilayer wiring structure according to the second embodiment of the present invention.

FIG. 9 is an exploded perspective view showing a multilayer wiring board for use in a semiconductor device having a multilayer wiring structure according to the second embodiment of the present invention. As shown in FIG. 9, the board comprises signal wiring layers S1 and S2, a power supply layer 21-1, and a ground layer 21-2. The signal wiring layers S1 and S2 are provided between the power supply layer 21-1 and the ground layer 21-2. The layers S1, S2, 21-1 and 21-2 are isolated from each other by insulating layers 20 (not shown). The signal wiring layer S1 comprises an insulator 10 and signal wires 13-1 provided thereon, and the signal wiring layer S2 comprise an insulator 10 and signal wires 13-2 provided thereon. The power supply layer 21-1 comprises an insulator 10 and a power supply conductor pattern constituted by parallel strip-shaped conductors 22-1. The ground layer 21-2 comprises an insulator 10 and a ground conductor pattern constituted by parallel strip-shaped conductors 22-2. The conductors 22-1 of the power supply layer 21-2 and the conductors 22-2 of the ground layer 21-2 are connected to each other through via-holes 15 which are formed in appropriate positions as explained below. As a result, each of the power supply layer 21-1 and the ground layer 21-2 has different potentials at the same time.

Furthermore, in the structure of FIG. 9 also, the signal wires 13-1 of the signal wiring layer S1 are arranged in parallel with the conductors 22-1 of the power supply layer 21-1, and the wires 31-2 of the signal wiring layer S2 are arranged in parallel with the conductors 22-2 of the ground layer 21-2, as in the first embodiment.

Figure 10:
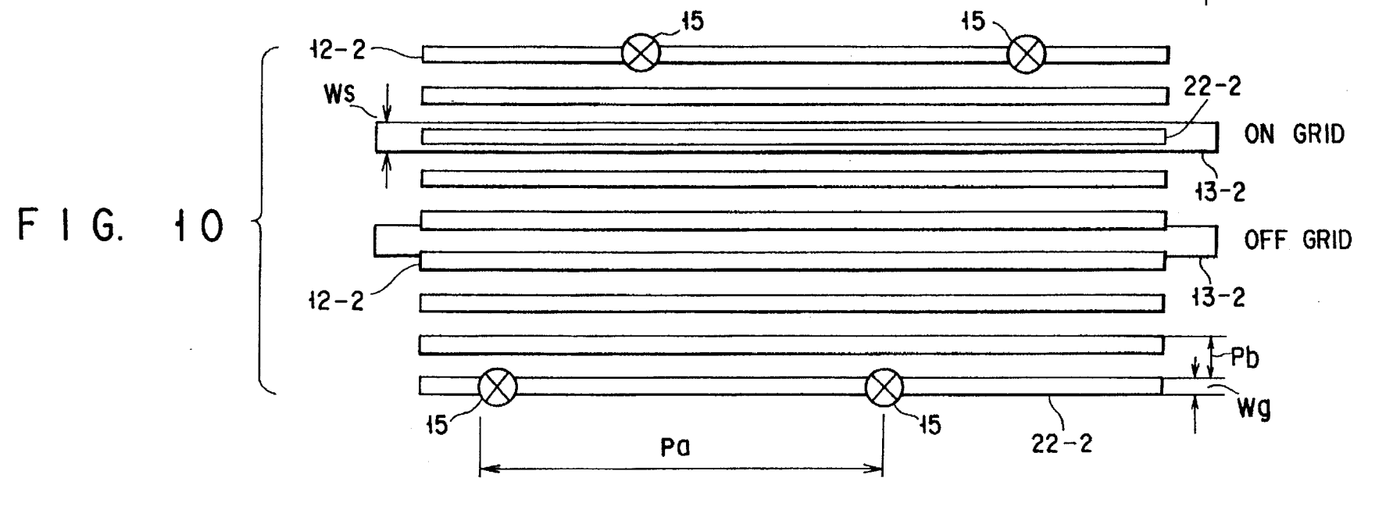
FIG. 10 is a plan view, which shows portions of the structure shown in FIG. 9 and illustrates positions of via-holes, as viewed in a given direction.

FIG. 10 is a plan view showing the conductors 22-2 of the ground conductor pattern of the ground layer 21-2 and the wires 13-2 of the signal wiring layer S2 as viewed in a direction A shown in FIG. 9. As shown in FIG. 10, the signal wires 13-2 are situated parallel with the conductors 22-2 of the ground conductor pattern, and the signal wires 13-2 is in either ON GRID or OFF GRID relative to the conductor 22-2 as in the signal wire shown in FIG. 8. Further, FIG. 10 illustrates positions of the via-holes 15, which are formed in such a manner as to satisfy the following formula:

$$Pa \leq 20\ Pb \qquad (4)$$

where Pa is a distance between the adjacent via-holes 15, and Pb is a pitch (hereinafter referred to as "pattern pitch") at which the conductors are arranged.

The conductors 22-1 of the power supply layer 21-1 are connected to the conductors 22-2 of the ground layer 21-2 through the via-holes which are formed in appropriate positions which satisfy the above formula (4), thereby obtaining a more advantageous electrical characteristic. In such a manner, the distance between the adjacent via-holes 15 may be equal to or less than twenty times the pattern pitch of the conductors, or may be equal to or less than one-fourth of a signal wave.

Figure 11:
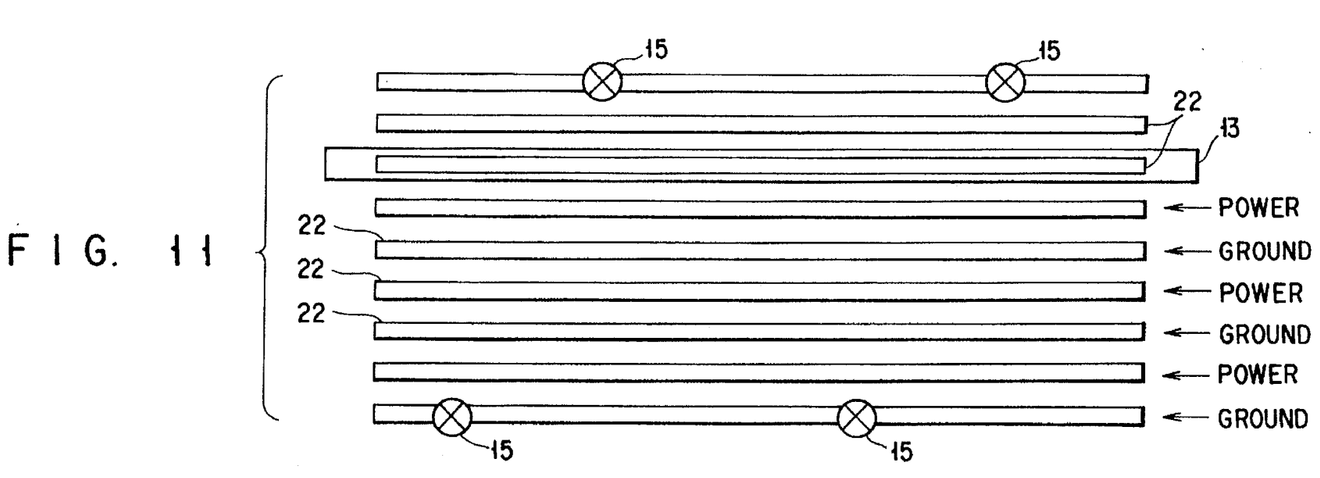
FIG. 11 is a first plan view showing, as viewed in the same direction as in FIG. 10, an example of a conductor pattern of each of the power supply/ground layers, which has different potentials at the same time, according to the second embodiment of the present invention.
Figure 12:
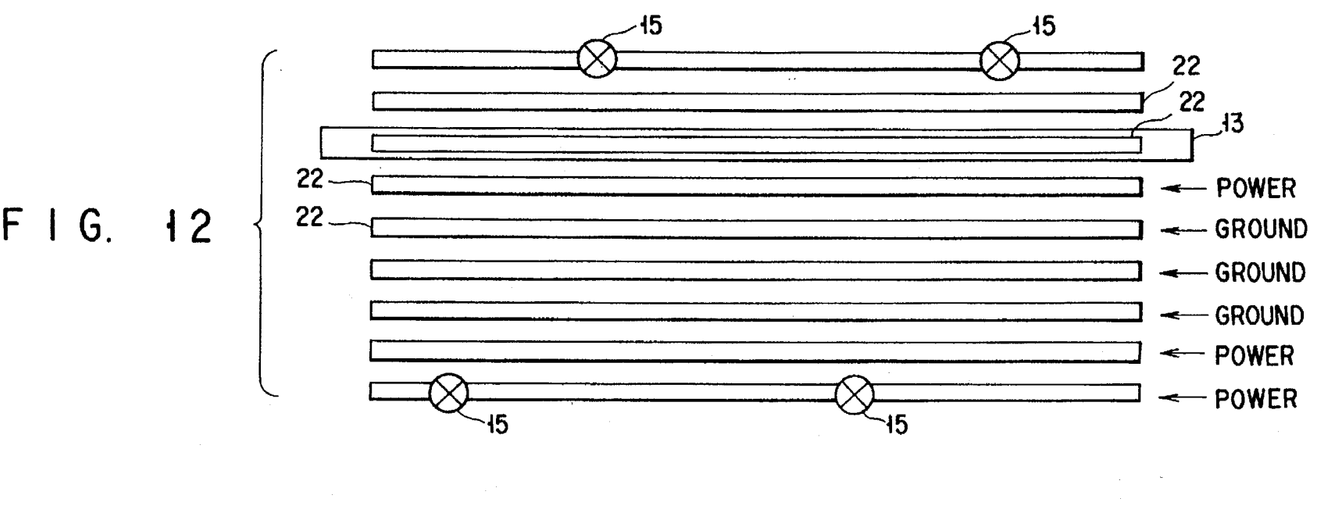
FIG. 12 is a second plan view showing, as viewed in the same direction as in FIG. 10, another example of the conductor pattern of each power supply/conductor layer, having different potentials at the same time, according to the second embodiment of the present invention.

FIGS. 11 and 12 are plan views each showing an example of the conductor pattern of the power supply/ground layer, which has different potentials at the same time, according to the second embodiment of the present invention.

Referring to FIG. 11, the via-holes 15 are situated to satisfy the above formula (4), and extend to connect the power supply/ground layers as shown in FIG. 9, and the conductors 22 of each of the power supply/ground layers are constituted by power supply conductors (POWER) and ground conductors (GROUND) which are alternately arranged. This arrangement is advantageous from the standpoint of mounting of elements.

In the structure shown in FIG. 12 also, the via-holes 15 are formed in appropriate positions which satisfy the equation (4), in the power supply conductors (POWER) and the ground conductors (GROUND) of each power supply/ground layer. Arrangement of the power supply conductors and ground conductors of the same layer varies in accordance with uses of the wiring board.

By virtue of the above structural features of the present invention, the board having a plurality of power supply/ground layers can obtain an electrical characteristic similar to that of a board having a ground layer including a plane conductor pattern. In other words, such an electrical characteristic is obtained by the structure which includes at least two power supply/ground layers each of which has different potentials at the same time, and which establishes the same positional relationship as that of the structure shown in FIG. 10 (i.e. which establishes that positional relationship between the conductors of each power supply/ground layer and the wires of the signal wiring layer situated just below or just above the power supply/ground layer, with the insulating layer interposed therebetween, which is the same as the positional relationship of the structure shown in FIG. 10).

The material of which the multilayer wiring board is formed is selected from among conductive material such as Cu or Al, and the material of which the insulating layer is formed is selected from among resin material such as polyimide or ceramic material such as alumina, in accordance with manufacturing processes and uses of the board. The thickness of the insulating layer and the thickness of the power supply/ground layer, etc. are determined on the basis of an electrical design and characteristic impedance, etc.

Figure 13:
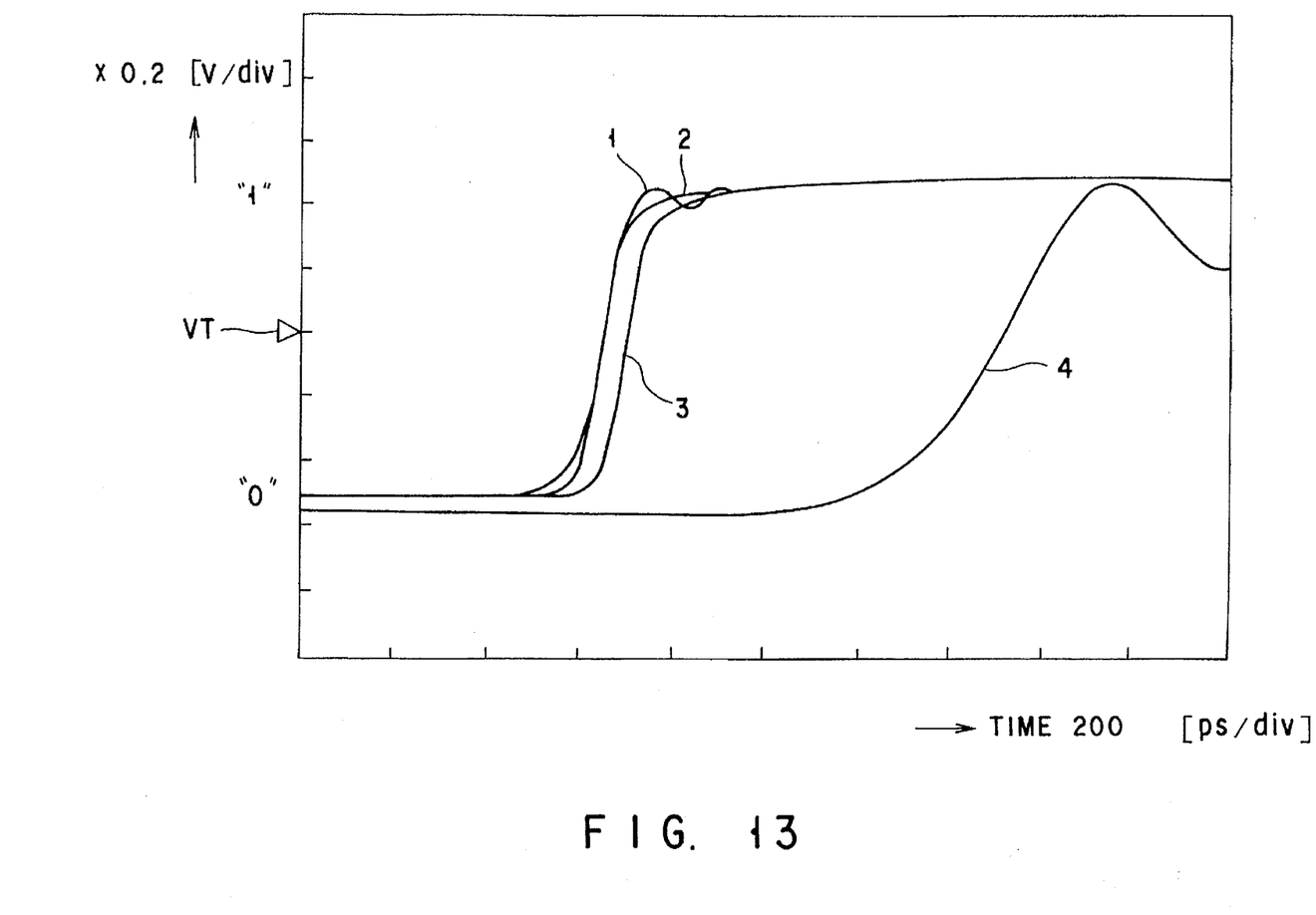
FIG. 13 is a view which shows waveforms obtained in the present invention and illustrates signal propagation delay.

FIG. 13 is a view showing waveforms of signals, which are respectively obtained in the cases where the aforementioned various conductor patterns are used, and illustrating signal propagation delay in each of the conductor patterns. Specifically, this figure shows variation of each of the waveforms from level "0" of a CMOS logic to level "1" thereof. In this figure, a level "VT" denotes a switching point of the CMOS logic, 1 denotes the waveform obtained in the case of using the conductor and wiring patterns of the present invention, 2 denotes the waveform obtained in the case of using the square film-like conductor pattern and the 10 wiring pattern which are shown in FIG. 5, 3 denotes the waveform obtained in the case of using the mesh conductor pattern (45° mesh type) and the wiring pattern which are shown in FIG. 3, and 4 denotes the waveform obtained in the case of using the mesh conductor pattern (90° mesh type) and the wiring pattern which are shown in FIG. 2. As is clear from FIG. 13, the present invention obtains an similar electrical characteristic that obtained in the case of using the plane conductor pattern. In the waveform obtained by the present invention, there is a vibration at an initial stage of level "1", but the vibration of this stage does not become hindrance to signal propagation at all.

As explained above, the multilayer wiring structure of the present invention is suitable for high-speed signal propagation. Further, in the multilayer wiring structure, unlike a conventional mesh pattern, the parallel strip-shaped conductors of the conductor pattern are arranged in parallel with the signal wires, thereby obtaining the electrical characteristic similar to that obtained in the case of using the plane conductor pattern.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A multilayer wiring structure for use in a semiconductor device, comprising:
    a potential supply layer including a plurality of parallel strip-shaped conductors, each of which has a predetermined potential; and
    a signal wiring layer provided on said potential supply layer, with an insulating layer interposed therebetween, said signal wiring layer including wires which are arranged in parallel with the parallel strip-shaped conductors.

2. The multilayer wiring structure according to claim 1, further comprising: another pair of a potential supply layer and a signal wiring layer which are identical to said potential supply layer and said signal wiring layer, and which have the same positional relationship with each other as that between said potential supply layer and said signal wiring layer; and another insulating layer interposed said another pair of the potential supply layer and the signal wiring layer.

3. The multilayer wiring structure according to claim 1, wherein a width of each of the parallel strip-shaped conductors of said potential supply layer is equal to or less than twice a width of each of the wires of said signal wiring layer, and a pitch at which the parallel strip-shaped conductors are arranged is equal to or less than three times the width of said each of the wires.

4. The multilayer wiring structure according to claim 1, wherein a width of each of the parallel strip-shaped conductors of said potential supply layer is greater than a width of each of the wires of said signal wiring layer and is not greater than twice the width of said each of the wires, and a pitch at which the parallel strip-shaped conductors are arranged is greater than the width of said each of the wires and is not greater than three times the width of said each of the wires.

5. The multilayer wiring structure according to one of claims 3 and 4, wherein the wires of said signal wiring layer include at least one wire which is situated opposite to one of the parallel strip-shaped conductors and at least one wire which is situated opposite to a space between adjacent two of the parallel strip-shaped conductors.

6. The multilayer wiring structure according to claim 5, further comprising another potential supply layer which is identical to said potential supply layer, and via-holes which are formed in at least one of parallel strip-shaped conductors of said another potential supply layer at a pitch, which is equal to or less than twenty times a pitch at which the parallel strip-shaped conductors are arranged, such that the via-holes connect said potential supply layer and said another potential supply layer.

7. The multilayer wiring structure according to claim 6, wherein those parallel strip-shaped conductors of the parallel strip-shaped conductors which have a high potential and those parallel strip-shaped conductors of the parallel strip-shaped conductors which have a low potential are alternately arranged.

8. The multilayer wiring structure according to claim 1, wherein said insulating layer is formed of any one of resin material and ceramic material.

9. A multilayer wiring structure which is made up of a power supply/ground layer and a signal wiring layer situated just below or just above said power supply/ground layer, and on which a plurality of semiconductor elements are mounted, the multilayer wiring structure comprising:
    a plurality of parallel strip-shaped conductors which are included in said power supply/ground layer;
    a plurality of wires which are included in said signal wiring layer, and arranged in parallel with the parallel strip-shaped conductors of said power supply/ground layer; and an insulating layer interposed between said power supply/ground layer and said signal wiring layer.

10. The multilayer wiring layer according to claim 9, further comprising: another pair of a power supply/ground layer and a signal wiring layer which are identical to said power supply/ground layer and said signal wiring layer, and which have the same positional relationship with each other as that between said power supply/ground layer and said power supply/ground layer; and another insulating layer interposed between said another pair of the power supply/ground layer and the signal wiring layer.

11. The multilayer wiring layer according to claim 9, wherein a width of each of the parallel strip-shaped conductors of said power supply/ground layer is equal to or less than twice a width of each of the wires of said signal wiring layer, and a pitch at which the parallel strip-shaped conductors are arranged is equal to or less than three times the width of said each of the wires.

12. The multilayer wiring layer according to claim 9, wherein a width of the parallel strip-shaped conductors of said power supply/ground layer is greater than a width of each of the wires of said signal wiring layer and is not greater than twice the width of said each of the wires, and a pitch at which the parallel strip-shaped conductors are arranged is greater than the width of said each of the wires and is not greater than three times the width of said each of the wires.

13. The multilayer wiring layer according to one of claims 11 and 12, further comprising:

at least one power supply/ground layer and at least one signal wiring layer, which are identical to said power supply/ground layer and said signal wiring layer, which have the same positional relationship with each other as that between said power supply/ground layer and said signal wiring layer, and which are arranged such that said signal wiring layer and said at least one wiring layer are situated between said power supply/ground layer and said at least one power supply/ground layer;

at least two insulating layers which are respectively interposed between said signal wiring layer and said at least one signal wiring layer, and said at least one signal wiring layer and said at least one power supply/ground layer; and via-holes which are formed in at least one of the parallel strip-shaped conductors of each of said power supply/ground layer and said at least one power supply/ground layer at a pitch, which is equal to or less than twenty times the pitch at the parallel strip-shaped conductors which are arranged, such that the via-holes connect said power supply/ground layer and said at lease one power/ground layer.

14. The multilayer wiring structure according to claim 13, wherein the wires of said signal wiring layer includes: at least one wire which is arranged opposite to one of the parallel strip-shaped conductors of said power supply/ground layer; and at least one wire which is arranged opposite to a space between adjacent two of the parallel strip-shaped conductors of said power supply/ground layers, and the wires of said at least one signal wiring layer includes: at least one wire which is arranged opposite to one of the parallel strip-shaped conductors of said at least one power supply/ground layer; and at least one wire which is arranged opposite to a space between adjacent two of the parallel strip-shaped conductors of said at least one power supply/ground layer.

15. The multilayer wiring structure according to claim 13, wherein the parallel strip-shaped conductors of said each of said power supply/ground layer and said at least one power supply conductor layer are constituted by power supply conductors and ground conductors, the power supply conductors and the ground conductors being alternately arranged.

* * * * *